United States Patent [19]
Hirata et al.

[11] Patent Number: 5,892,715
[45] Date of Patent: Apr. 6, 1999

[54] NON-VOLATILE SEMICONDUCTOR MEMORY DEVICE WITH VARIABLE SOURCE VOLTAGE

[75] Inventors: Masayoshi Hirata; Takahiko Urai, both of Tokyo, Japan

[73] Assignee: NEC Corporation, Tokyo, Japan

[21] Appl. No.: 888,924

[22] Filed: Jul. 7, 1997

[30] Foreign Application Priority Data

Jul. 30, 1996 [JP] Japan .................................. 8-200730

[51] Int. Cl.⁶ .................................................. G11C 16/06
[52] U.S. Cl. ............... 365/185.29; 365/218; 365/230.03; 365/189.09; 365/185.33
[58] Field of Search ......................... 365/185.01, 185.29, 365/185.33, 189.01, 189.09, 218, 230.03

[56] References Cited

U.S. PATENT DOCUMENTS

| | | | |
|---|---|---|---|
| 5,172,338 | 12/1992 | Harari et al. | 365/185.03 |
| 5,270,979 | 12/1993 | Harari et al. | 365/185.09 |
| 5,396,468 | 3/1995 | Harari et al. | 365/218 |
| 5,504,760 | 4/1996 | Harari et al. | 371/40.1 |

Primary Examiner—Viet Q. Nguyen
Attorney, Agent, or Firm—Young & Thompson

[57] ABSTRACT

In a non-volatile semiconductor memory device, a memory cell array composed of a plurality of non-volatile memory cells is provided. Each word line is connected to a row of the memory cell array, and each bit line is connected to a column of the memory cell array. The memory cell array is divided into N blocks (N is an integer more than 1) in a row direction. A control signal generating section monitors erase operations to each of the N blocks to generate an erase operation history data for each of the N blocks and generates a control signal for each of the N blocks other than a selected block based on the erase operation history data for the corresponding block, when a write operation is performed to the selected block. A source voltage generating section generates a source voltage for each of the N blocks other than the selected block based on the corresponding control signal to supply the generated source voltage to a common source node of the corresponding block, when the write operation is performed to the selected block.

18 Claims, 10 Drawing Sheets

201

NON-VOLATILE SEMICONDUCTOR MEMORY DEVICE WITH VARIABLE SOURCE VOLTAGE

BACKGROUND OF THE INVENTION

1. Field of the Invention

The present invention relates to a non-volatile semiconductor memory device, and more particularly to a non-volatile semiconductor memory device such as an electrically programmable and erasable flash memory.

2. Description of the Related Art

In an electrically programmable and erasable non-volatile semiconductor memory device such as a flash memory, when a data is to be written in a memory cell, it is necessary for potentials to be applied to a control gate and a drain of the memory cell. However, the potentials are unnecessarily applied to memory cells to which the data is not to be written. This problem results from a memory array block structure and affects data holding performance of the memory cell.

FIG. 1 is a circuit diagram illustrating a part of the structure of a conventional flash memory. Referring to FIG. 1, the conventional flash memory is composed of memory cell array blocks 10 and 11. In each of the memory cell array blocks 10 and 11, a plurality of memory cells C000 to C0mn or C100 to C1mn are arranged in a matrix manner. The source terminals of the memory cells for each array block 10 or 11 are connected in common to a common source node such that a plurality of memory cell data stored in the memory cells can be collectively erased. The drain terminals of the plurality of memory cells C000 to C0mn or C100 to C1mn are connected to a plurality of bit lines BL00 to BL0m or BL10 to BL1m for every column, respectively. The set of bit lines BL00 to BL0m for the memory cell array block 10 and the set of bit lines BL10 to BL1m for the memory cell array block 11 are electrically independent from each other. The control gates of the plurality of memory cells C000 to C0mn and C100 to C1mn are connected to a plurality of word lines WL0 to WLn for every row, respectively. The word lines WL0 to WLn are connected in common to the memory cell array blocks 10 and 11.

The conventional flash memory is also composed of source voltage supplying circuits 20 and 21 for supplying predetermined source voltages to the common source terminals of the memory cell array blocks 10 and 11, respectively. The source voltage supplying circuit 20 includes N-type MOS transistors N01 and N02, and a P-type MOS transistor P01. The MOS transistors N01, N02 and P01 receive control signals SB0, SG0 and EB0 supplied from a control circuit (not shown) at the gates, respectively. The source voltage supplying circuit 21 includes N-type MOS transistors N11 and N12, and a P-type MOS transistor P11. The MOS transistors N11, N12 and P11 receive, at the gates, signals SB1, SG1 and EB1 supplied from the control circuit (not shown), respectively.

The conventional flash memory is further composed of a source bias voltage generating circuit 200 including a circuit section 201 for the memory cell array block 10. The source bias voltage generating circuit 200 includes a circuit section having the same circuit structure as the circuit section 201 for the array block 11. FIG. 2 is a circuit diagram illustrating the structure of the circuit section 201. Referring to FIG. 2, the circuit section 201 is composed of a P-type MOS transistor PT0 and N-type MOS transistors NT0 and NT1. These MOS transistors are connected in series in this order between the power supply Vpp and the ground line. The circuit section 201 is also composed of resistors R1 to Rn which are connected in series between the ground line and the power supply Vpp for generating a reference voltage. A signal BSB which is in a low level in a write operation to the memory cell array block 11 is supplied to the gate of the MOS transistor NT1 and supplied to the gate of the MOS transistor PT0 in an inverted form. The gate of the MOS transistor NT0 is connected to a node between the resistors Rk and Rk+1.

Referring to FIG. 1 again, the relation between the respective terminal potentials when a data is written in the memory cell C000 of the memory cell array block 10 as a selected memory cell of a selected block will be described. In this case, the write operation is not performed to the memory cells C000 to C00n, C010 to C0mn and C100 to C1mn, that is, these memory cells are the non-selected memory cells. A write drain voltage of about 6 V is applied onto the memory cells C000 to C00n connected to the bit line BL00, and the bit lines BL01 to BL0m and BL10 to BL1m are in the open state. A write control gate voltage of about 12 V is applied onto the memory cells C000 to C0m0 and C100 to C1m0 connected to the word line WL0 and the word lines WL1 to WLn are set to 0 V. A write source voltage of 0 V is applied from the source voltage supplying circuit 20 to the source terminals of the memory cells C000 to C0mn via the common source node CS0, because the control signal SG0 is in the H level. At this time, hot electrons are generated between the source terminal and the drain terminal of this memory cell C000 and injected into a floating gate (FG) of the selected memory cell, so that the threshold voltage of the selected memory cell C000 rises. In the flash memory, the data is written by making the threshold voltage of the selected memory cell rise in this manner.

In this case, the non-selected memory cells C001 to C00n receive the same write drain voltage as the selected memory cell C000. Also, the memory cells C010 to C0m0 and C100 to C1m0 receive the same write control gate (CG) voltage as the selected memory cell C000. As a result, a problem of data holding performance occurs in these non-selected memory cells. Especially, the memory cells C100 to C1m0 are in the memory cell array block 11 different from the memory cell array block 10 in which the selected memory cell C000 is present. However, the memory cells C100 to C1m0 receive the same write control gate voltage as the selected memory cell C000. When the erase operation and the write operation are repeated many times to the memory cell array block 10, the write control gate voltage is also applied to the control gates of the memory cells in the memory cell array block 11 for a long time period.

The application time period during when the non-selected memory cells of the memory cell array block 11 receive the unnecessary write control gate voltage can be expressed by the following equation.

$$TG = \{TW \times NB \times (NA-1) \times NCYC\}\{TW \times (NB1)\}$$

where TG is the application time (a gate disturb time) during when the unnecessary write control gate voltage is applied, TW is a write time period, NB is the number of bit lines/one memory cell array block, NA is the number of array blocks in which the word lines are connected in common, and NCYC is the number of times of write operation. The first term of the above equation is the application time period of the write control gate voltage to the memory cell, e.g., C100 when the write operation is performed to the memory cell array block, e.g., 10 in the above case. The second term of the equation is the application time period of the write control gate voltage to the memory cell C100 when the write operation is performed to the memory cell array block. The number of times of the write operation NCYC has great influence to the application time period TG. Therefore, it could be considered that the application time period TG to a memory cell is greatly influenced by the first term. In the currently available product, $10^5$ times are guaranteed.

Next, the problem of data holding performance caused in case of receiving the unnecessary write control gate voltage will be described. FIG. 3A is a diagram illustrating each of the terminal voltages, electric fields, and the directions of movement of electrons in the memory cells C010 to C0m0 and C100 to C1m0 which receive the same write control gate voltage as the written cell C000.

Referring to FIG. 3A, when the high write control gate voltage Vg of about 12 V is applied to the control gate (CG) of the memory cell, when the source terminal (S) is set to the ground potential, and when the drain terminal (D) is set to the voltage of about 6 V, the electric field directs from the control gate CG toward the source, the drain and the channel section (between the source and the drain). Also, because the electric field is strong, electrons pass through an oxide film by tunneling phenomenon and are accumulated in the floating gate (FG). This phenomenon is referred to as gate disturb hereinafter. The longer this gate disturb time period TG becomes, the more the threshold voltage of the non-selected memory cell rises. At last, a data holding error will occur. The memory cell receives the influence of the application time period depending upon the erase operation to be performed to the memory cell.

In order to solve the above gate disturb phenomenon, a potential (to be referred to as a source bias voltage hereinafter) is supplied to the common source node CS1 of the memory cell array block 11 which does not contain the selected memory cell C000. The state of the memory cell at this time will be described with reference to FIGS. 3B and 3C.

FIG. 3B is a diagram illustrating the state in which the source bias voltage is applied to the non-selected memory cell. Referring to FIG. 3B, in order to solve the gate disturb phenomenon, the source bias voltage of about 2.75 V is applied to the source terminal. The drain terminal and the control gate are applied with the voltage of about 2.75 V and the voltage of about 12 V, respectively. As a result, the electric field which directs from the control gate (CG) toward the source terminal (S), the drain (D), and the channel section is weakened so that the tunneling phenomenon of electrons is restrained in the memory cells C100 to C1m0.

FIG. 3C is a diagram illustrating the source bias effect of the memory cells such as the memory cells C10n to C1mn which do not receive gate disturb. Referring to FIG. 3C, the control gate (CG) in this case is grounded. The drain is opened and the voltage of about 2.75 V is applied to the source terminal. The electric field directs from the source terminal (S) toward control gate (CG). At this time, if a lot of electrons are accumulated in the floating gate (FG), the strong electric field is generated between the source terminal (S) and the floating gate (FG), so that electrons performs tunneling toward the source terminal (This phenomenon is referred to as soft-erase hereinafter). This soft-erase causes movement of electrons in the opposite direction to the gate disturb, and also it causes the problem when a data is held.

Next, FIG. 4 is a graph illustrating a relation of threshold voltage change quantity of a memory cell and source bias voltage. Referring to FIG. 4, a curve A indicates the threshold voltage change quantity of the memory cell which receives gate disturb. The threshold voltage change quantity of the memory cell becomes small and at last becomes 0, as the source bias voltage becomes high. Also, a curve C indicates the threshold voltage change quantity of the memory cell which receives the soft-erase. The threshold voltage change quantity of the memory cell becomes large as the source bias voltage becomes high. As seen from FIG. 4, when a source bias voltage is determined in the flash memory, it is necessary that the source bias voltage is set to solve the gate disturb and the soft-erase. For this purpose, in the conventional example, a memory cell threshold voltage permission value VA is set (alternate long and short dash line in the figure). The source bias voltage PG and PS are determined such that the threshold voltage does not exceed this permission value VA because of prevention of the gate disturb and soft-erase. Then, the source bias voltage is set to a voltage P1 as a middle value between the voltages Pg and PS.

Referring to FIG. 2, in the circuit section of the source bias voltage generating circuit 200 for the memory cell array block 11, the gate voltage of the MOS transistor NT0 is set by adjusting the resistors R1 to Rn which are connected in series between the power supply Vpp and the ground. The source bias voltage P1 which has been determined as above-mentioned is outputted as the output potential. This output voltage is supplied to the source voltage supplying circuit 21 as the source power supply VS. When the erase operation is performed to the memory cell array block 10, an erasure voltage Vpp is applied to the memory cell array block 10 via the MOS transistor P01 which is controlled in response to the signal EB0, and the source bias voltage vs is applied to the memory cell array block 11 via the MOS transistor N11 which is controlled in response to the signal SB1.

As described above, when the erase and write operations are repeatedly performed to the memory cells of the flash memory, the characteristic of the memory cell changes in accordance with the number of times of the repetition of the erase and write operations, more particularly, the write time period and the erasure time period. With this, the memory cell receives the above-mentioned gate disturb and soft-erase and changes the characteristic. Especially, the characteristic change of the memory cell which receives the soft-erase is conspicuous. This seems to be the phenomenon caused when electrons are trapped in the tunnel gate oxide film of the memory cell. However, the detail is not clear.

Referring to FIG. 4 once again, the characteristic change of the memory cell which receives the soft-erase will be described. As mentioned above, the curve C indicates the threshold voltage change quantity to the source bias voltage in the memory cell which receives the soft-erase. Especially, the curve C indicates the threshold voltage change of the memory cell receiving the soft-erase when there is the small number of times of the repetition of the write and erase operations. When the number of times of the repetition the write and erase operations increases, the soft-erase characteristic of the memory cell moves to the right direction, as shown by a curve B. Also, the source bias voltage PS having the permission level VA moves to the right direction when the threshold voltage changes by the soft-erase. In the conventional method, however, the source bias voltage PS is set based on the value when there is the small number of times of the repetition of the write and erase operations. Therefore, the set source bias voltage PS has a difference from an optimal source bias voltage of the memory cell which is subjected to the repetitive write and erase operations many times. Therefore, the source bias voltage has a greater margin to the soft-erase. On the other hand, the source bias voltage is relatively more severely to the gate disturb than the soft-erase set.

In this manner, in the above-mentioned conventional non-volatile semiconductor memory device, the source bias voltage is determined such that a threshold voltage change quantity due to the gate disturb and the soft-erase does not exceed the permission level. Also, the source bias voltage is set to the middle value. However, in this case, the source bias voltage is set based on the value when there is a small repetition number of times of the write/erase operation. Therefore, the margin to the soft-erase increases more with respect to an optimal source bias voltage of the memory cell receiving the many repetition number of times of the write/erase operation. There is a problem more severely to the gate disturb than the soft-erase set.

SUMMARY OF THE INVENTION

An object of the present invention is to provide a non-volatile semiconductor memory device in which the above problem can be solved.

Another object of the present invention is to provide a method of suppressing influence due to gate disturb and soft-erase, in which an optimal source bias voltage can be set irrespective of the repetition number of times of the write/erase operation so that the, and a non-volatile semiconductor memory device for the same.

In order to achieve an aspect of the present invention, a non-volatile semiconductor memory device includes a memory cell array composed of a plurality of non-volatile memory cells which are arranged in a matrix manner, wherein each word line is connected to a row of the memory cell array, and each bit line is connected to a column of the memory cell array, and wherein the memory cell array is divided into N blocks (N is an integer more than 1) in a row direction, and source terminals of the memory cells of each of the N blocks are connected in common to a common source node, a control signal generating section for monitoring erase operations to each of the N blocks to generate an erase operation history data for each of the N blocks, the erase operation history data for each of the N blocks indicating history of the erase operations to the corresponding blocks, and for generating a control signal for each of the N blocks other than a selected block based on the erase operation history data for the corresponding block when a write operation is performed to the selected block, and a source voltage generating section for generating a source voltage for each of the N blocks other than the selected block based on the corresponding control signal to supply the generated source voltage to the common source node of the corresponding block, when the write operation is performed to the selected block.

The control signal generating section may include a storing section for storing the erase operation history data for each of the N blocks, and an output section for outputting the control signal for each of the N blocks other than the selected block based on the erase operation history data stored in the storing section for the corresponding block, when the write operation is performed to the selected block. In this case, the control signal generating section further includes an updating section for updating the erase operation history data for each of the N blocks based on the erase operation during initialization of the corresponding block.

The erase operation history data for each of the N blocks may be a number of erase operations to the corresponding block. Alternatively, the erase operation history data for each of the N blocks may be a total erase operation time to the corresponding block. In an either case, the control signal generating section desirably includes a plurality of additional non-volatile memory cells for storing the erase operation history data for each of the N blocks, a latching section for latching the erase operation history data for each of the N blocks from the plurality of additional memory cells, an output section for outputting the control signal for each of the N blocks based on the latched erase operation history data for the corresponding block, an erasing section for erasing a part of the plurality of additional memory cells corresponding to one of the N blocks to which the erase operation is performed, an adding section for adding one to the latched erase operation history data for the one block to which the erase operation is performed, and a write section for writing the added erase operation history data for the one block in the plurality of additional memory cells.

The output section may include a section for classifying the erase operation history data for each of the N blocks into one of a plurality of classes based on a magnitude of the erase operation history data, and for outputting a class signal indicating the classified class as the control signal for the corresponding block. In this case, the source voltage generating section generates the source voltage having a magnitude, which is determined based on the class signal, for each of the N blocks other than the selected block to supply to the common source node for the corresponding block.

In order to achieve another aspect of the present invention, a method of suppressing influence of gate disturb and soft erase in a non-volatile semiconductor memory device, includes the steps of:

providing a memory cell array composed of a plurality of non-volatile memory cells which are arranged in a matrix manner, wherein each word line is connected to a row of the memory cell array, and each bit line is connected to a column of the memory cell array, and wherein the memory cell array is divided into N blocks (N is an integer more than 1) in a row direction, and source terminals of the memory cells of each of the N blocks are connected in common to a common source node;

reading an erase operation history data for each of the N blocks from a storage section when a write operation is performed to a selected block, wherein the erase operation history data for each of the N blocks indicates history of the erase operations to the corresponding block;

generating a source voltage for each of the N blocks other than the selected block based on the read erase operation history data; and supplying the generated source voltage to the common source node of the corresponding block to suppress movement of electrons from or to a floating gate of each of the memory cells in the corresponding block.

In order to achieve still another aspect of the present invention, a non-volatile semiconductor memory device, includes a first memory cell array composed of a plurality of non-volatile memory cells which are arranged in a matrix manner, wherein each word line is connected to a row of the memory cell array, and each bit line is connected to a column of the memory cell array, and wherein the memory cell array is divided into N blocks (N is an integer more than 1) in a row direction, and source terminals of the memory cells of each of the N blocks are connected in common to a common source node, a second memory cell array comprising a plurality of non-volatile memory cells, for storing an erase operation history data for each of the N blocks, wherein the erase operation history data for each of the N blocks indicates history of the erase operation to the corresponding block, a reading section for reading the erase operation history data for each of the N blocks from the second memory cell array, a source voltage generating section for generating a source voltage, a control section for controlling the source voltage generating section to generate the source voltage for each of the N blocks other than a selected block based on the read erase operation history data, when a write operation is performed to the selected block, and a supplying section for supplying the generated source voltage to the corresponding common source node to suppress movement of electrons from or to a floating gate of each of memory cells in each of the N blocks.

DESCRIPTION OF THE PREFERRED EMBODIMENTS

Next, a non-volatile semiconductor memory device of the present invention will be described below in detail with reference to the accompanying drawings.

Figure 1:
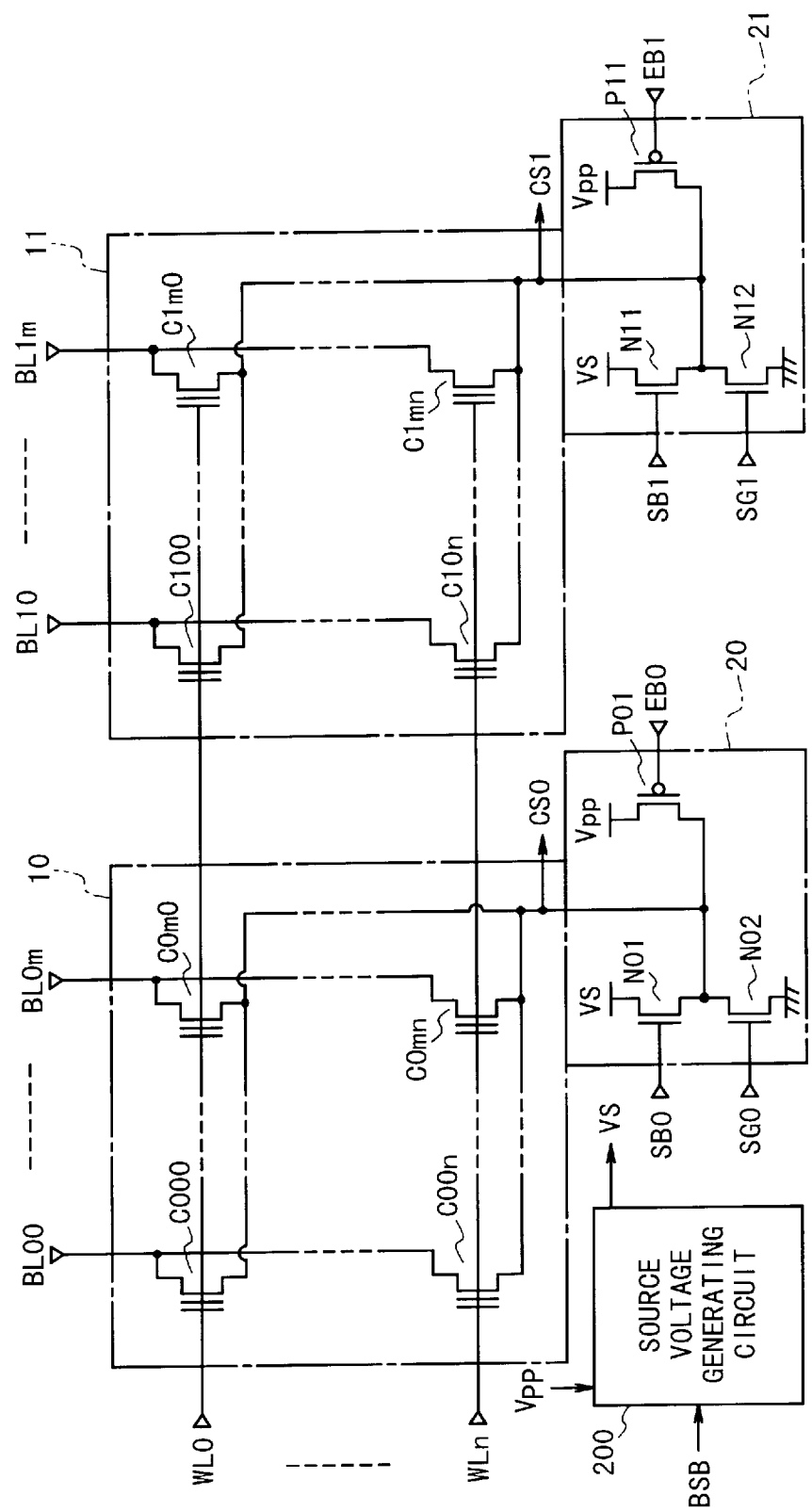
FIG. 1 is a block diagram illustrating the structure of an example of a conventional non-volatile semiconductor memory device.
Figure 2:
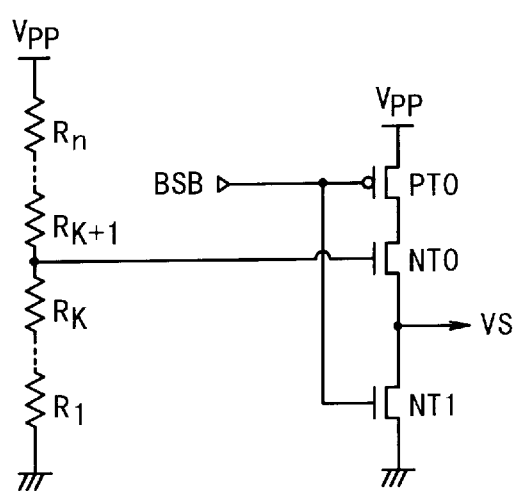
FIG. 2 is a circuit diagram illustrating the structure of a part of the source bias voltage setting circuit of FIG. 1.
Figures 3A, 3B, 3C:
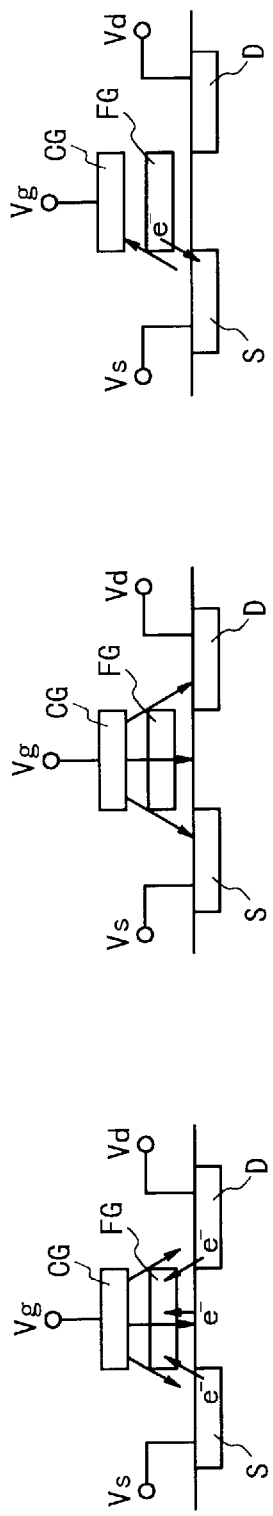
FIGS. 3A to 3C are diagrams illustrating the generation principle of soft-erase and gate disturb in a memory cell receiving the influence write and erase operations.
Figure 4:
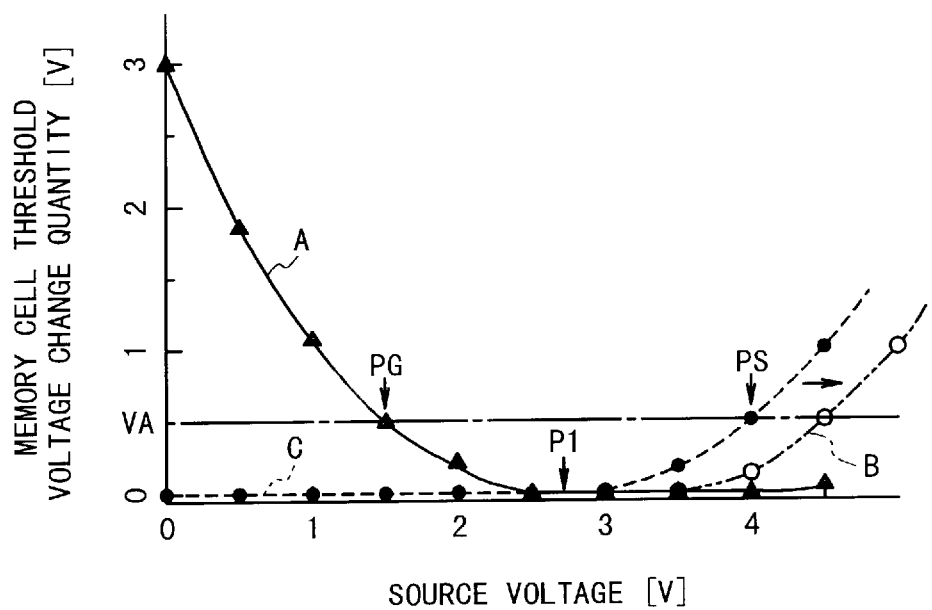
FIG. 4 is a characteristic diagram illustrating relation of source bias voltage and threshold voltage change quantity due to the gate disturb and the soft-erase in a conventional non-volatile semiconductor memory device.
Figure 5:
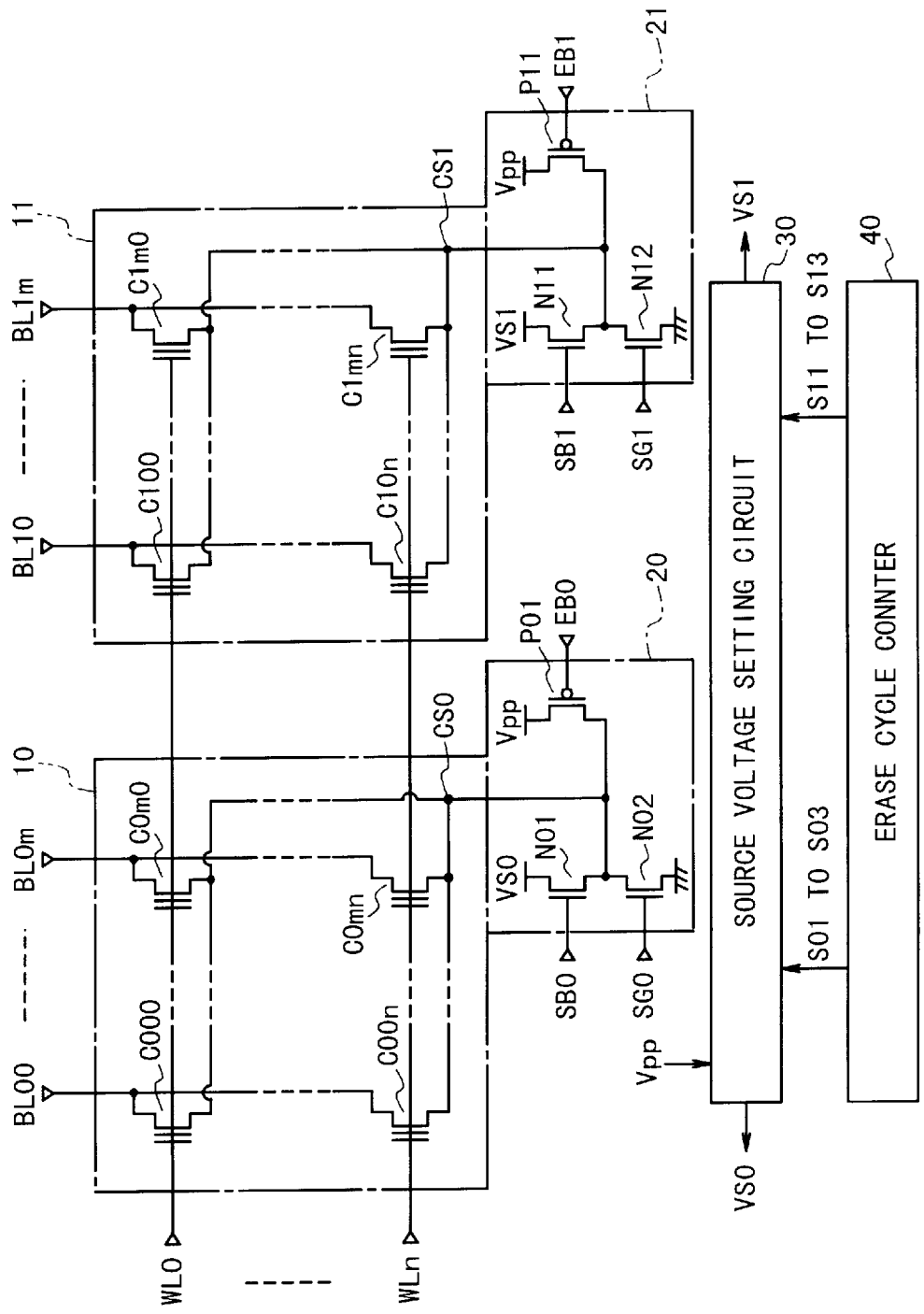
FIG. 5 is a block diagram illustrating the structure of the non-volatile semiconductor memory device according to a first embodiment of the present invention.

FIG. 5 is a block diagram illustrating the structure of the non-volatile semiconductor memory device according to the first embodiment of the present invention. In FIG. 5, the same reference numerals and symbols are assigned to the same components in FIG. 1, respectively.

Referring to FIG. 5, the non-volatile semiconductor memory device such as a flash memory in the first embodiment is composed of memory cell array blocks 10 and 11, source voltage supplying circuits 20 and 21, a source voltage setting circuit 30, and an erase cycle counter 40.

In each of the memory cell array blocks 10 and 11, a plurality of non-volatile memory cells C000 to C0mn or C100 to C1mn are arranged in a matrix manner. The source terminals of the memory cells for each array block 10 or 11 are connected in common to a common source node CS0 or CS1 such that a plurality of memory cell data stored in the memory cells can be collectively erased. The drain terminals of the plurality of memory cells C000 to C0mn or C100 to C1mn are connected to a plurality of bit lines BL00 to BL0m or BL10 to BL1m for every column, respectively. The set of bit lines BL00 to BL0m for the memory cell array block 10 and the set of bit lines BL10 to BL1m for the memory cell array block 11 are electrically independent from each other. The control gates of the plurality of memory cells C000 to C0mn and C100 to C1mn are connected to a plurality of word lines WL0 to WLn for every row, respectively. The word lines WL0 to WLn are connected in common to the memory cell array blocks 10 and 11.

The source voltage supplying circuits 20 and 21 supply predetermined optimal source bias voltages VS0 and VS1 to the common source nodes CS0 and CS1 of the memory cell array blocks 10 and 11, respectively. The source voltage supplying circuit 20 includes N-type MOS transistors N01 and N02, and a P-type MOS transistor P01. The MOS transistors N01 and N02 are connected in series between a potential line VS0 and a ground line and the MOS transistor P01 is connected to a potential line Vpp and the common source node CS0 between the MOS transistors N01 and N02. The common source node CS0 is connected to the source terminals of the memory cells of the memory cell array block 10. The MOS transistors N01, N02 and P01 receive, at the gates, control signals SB0, SG0 and EB0 supplied from a control circuit (not shown), respectively. The source voltage supplying circuit 21 includes N-type MOS transistors N11 and N12, and a P-type MOS transistor P11. The MOS transistors N01 and N02 are connected in series between the potential line VS1 and the ground line and the MOS transistor P01 is connected to the potential line Vpp and the common source node CS1 between the MOS transistors N11 and N12. The common source node CS1 is connected to the source terminals of the memory cells of the memory cell array block 11. The MOS transistors N11, N12 and P11 receive, at the gates, signals SB1, SG1 and EB1 supplied from the control circuit (not shown), respectively.

The erase cycle counter 40 counts the number of times of an erase operation to each of the memory cell array block 10 or 11. The erase cycle counter 40 stores the count value as an erase operation history data. The erase cycle counter 40 supplies the erase operation history data to the source voltage setting circuit 30 in the form of voltage selection signals S01 to S03 or S11 to S13.

The source voltage setting circuit 30 generates source bias voltages VS0 and VS1 for the memory cell array blocks 10 and 11 based on the voltage selection signals S01 to S03 and S11 to S13, respectively. The generated source bias voltages VS0 and VS1 are supplied to the source voltage supplying circuits 20 and 21, respectively.

Figure 7:
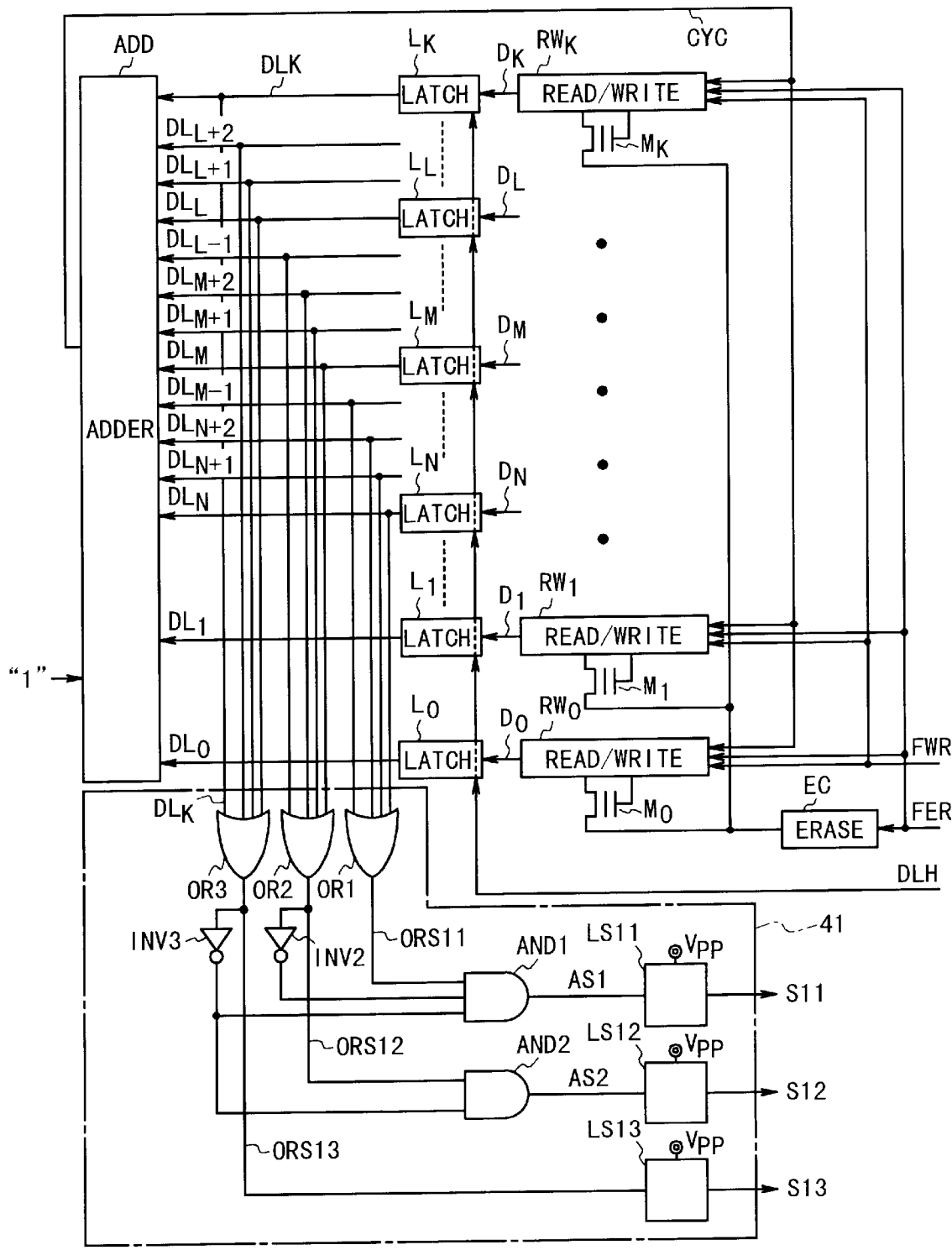
FIG. 7 is a circuit diagram illustrating the structure of a part of an erase cycle counter of FIG.
Figure 8:
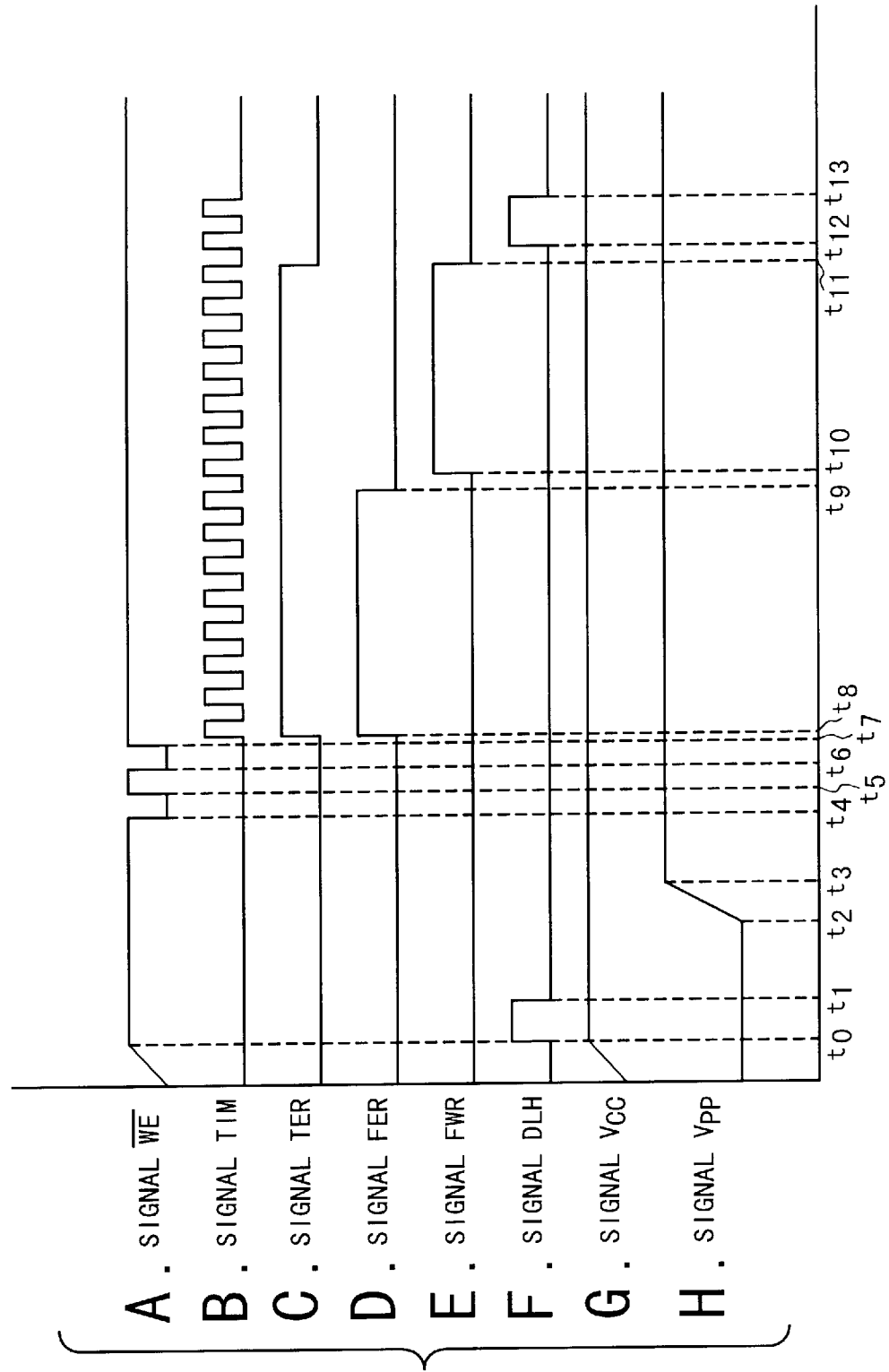
FIGS. 8A to 8H are time charts illustrating an example of the operation of the non-volatile semiconductor memory device in the first embodiment.

FIG. 7 is a circuit diagram illustrating the structure of a section of the erase cycle counter 40 in the first embodiment. The section is provided for the memory cell array block 11 but a section for the memory cell array block 10 has the same circuit structure as that for the array block 11. Referring to FIG. 7, the erase cycle counter section 401 is composed of non-volatile memory cells M0 to MK, read/write circuits RW0 to RWK, an erase circuit EC, latch circuits L0 to LK, an adder ADD, and a determining circuit 41.

The memory cells M0 to MK stores the number of times of an erase operation to the memory cell array block 11 as an erase operation history data. The read/write circuits RW0 to RWK read the erase operation history data from the memory cells M0 to MK upon the power on. The read out erase operation history data is latched by the latches L0 to LK. The erase circuit EC erases the memory cells M0 to MK in response to the erase control signal FER after the erase cycle data is read out. The latch circuits L0 to LK latch and hold read-out erase cycle data D0 to DK in response to a latch control signal DLH, respectively. The adder ADD adds "1" to the output signals DL0 to DLK from the latch circuits L0 to LK to update the erase cycle data. The updated erase cycle data CYC is written in the memory cell M0 to MK by the read/write circuits RW0 to RWK in response to the write control signal FWR. That is, the memory cells M0 to MK holds the erase cycle data CYC until the memory cell array block 11 is next erased.

The determining circuit 41 classifies the latch circuit output signals DL0 to DLK and generates each of the potential selection signals S11, S12 and S13 based on the classifying result. The determining circuit 41 is composed of OR logic gates OR1, OR2 and OR3, inverters INV2 and INV3, AND logic gates AND1 and AND2, and level shifters LS11, LS12 and LS13. The OR logic gates OR1, OR2 and OR3 input specific sets of latch circuit output signals, [DLN, DLN+1, DLN+2, . . . , DLM–1] [DLM, DLM+1, DLM+2, . . . , DLL–1], [DLL, DLL+1, DLL+2, . . . , DLK] to output OR signals ORS11, ORS12 and ORS13, respectively. The inverters INV2 and INV3 inverts the outputs of the OR signals ORS12 and ORS13, respectively. The AND logic gate AND1 inputs the OR signal ORS11, the inverted ORS12 and the inverted ORS13. The AND logic gate AND2 inputs the OR signal ORS12 and the inverted ORS13. The AND logic gates AND1 and AND2 decode the received signals to output decoding signals AS1 and AS2, respectively. The level shifters LS11, LS12 and LS13 input the decoding signals AS1 and AS2 and the OR signal ORS13, and change the potential level to the power supply potential level Vpp or the ground level GND for the write/erasure operation. Then, the level shifters LS11, LS12 and LS13 output the potential selection signals S11, S12 and S13, respectively. The section of the erase cycle counter 40 for the memory cell array block 10 is similar.

Next, the operation of the non-volatile semiconductor memory device in the first embodiment will be described.

First, the operation of the erase cycle counter 401 will be described with reference to the time charts of FIGS. 8A to 8H. When a power supply is turned on, the erase cycle data erase signal FER and the erase cycle data write signal FWR are in L level to indicate that the read/write circuits RW0 to RWK are in the read state. The erase cycle data signals DL0 to DLK read out at this time are taken in the latch circuits L0 to LK when the latch control signal DL is set to the H level at a time t0. Then, the erase cycle data signals DL0 to DLK are held when the signal DL is reset to the L level at a time t1. In this case, the signal DL is set or reset in response to the above pulse signal from a circuit (not shown) which is generally called a power on/reset circuit for outputting one pulse when the power supply potential Vcc is started-up.

In response to this operation, the erase cycle data represented by the signals DL0 to DLK from the latch circuits L0 to LK is added with "1" by the adder ADD and are inputted to the read/write circuit RW0 to RWK as the updated erase cycle data CYC, respectively. This state is maintained until a write signal is inputted.

Next, the erase operation will be described. First, the write/erasure power supply voltage Vpp rises to a necessary potential level of, for example, 12 V at times t2 to t3. Next, in order to input an erasure command for the memory cell array block 11, a write enable signal WE of the L level is inputted twice in a pulse manner from the external equipment at times t4 to t7. The control circuit (not shown) which has received the erasure command outputs an erasure state signal TER indicative of the memory cell array block 11 in the erasure state at a time t8. As a result, the erase cycle data erasure signal FER is issued to erase the memory cells M0 to MK which stores the erase cycle data. In response to the signal FER, the read/write circuits RW0 to RWK and the erasing circuit EC apply erasure voltages for the data erasure of the memory cells M0 to MK to the drain, gate and source of the memory cells M0 to MK, as in erasure of non-volatile memory cells. The control of the application time period is performed by counting the timer signal TIM by an internal timer (not shown). When ending, the erase cycle data erasure signal FER is reset to the L level at a time t9.

Next, the erase cycle data write signal FWR is set to the H level at a time t10. This signal FWR is supplied to the read/write circuits RW0 to RWK. In order to write the updated erase cycle data CYC in the memory cells M0 to MK, the read/write circuits RW0 to RWK apply the required voltages to the drain and the gate, respectively. As in the above data erasure, the control of the application time period is performed by counting the timer signal TIM. The signal FER is reset to the L level when ending at a time t11. At this point, the erasure of the memory cell array block is ended and the signal TER becomes L level.

Last, when the data latch signal DL is risen (t12), the updated erase cycle data is taken in the latch circuits L0 to LK. When the signal DL goes down (t13), the above erase cycle data is latched. The determining circuit 41 generates the decoding signals AS1, AS2 and ORS13 which correspond to the specific number of times. The level shifters LS11, LS12 and LS13 generate the potential selection signals S11, S12 and S13 in response to the supply of the decoding signals AS1, AS2 and ORS13. Therefore, the potential selection signals S11, S12 and S13 are sequentially set to the H level with increase of the erasure number of times of the erase operation to the memory cell array block 11, and is supplied to the source voltage setting circuit 30 as a signal to determine the source bias voltage.

Figure 6:
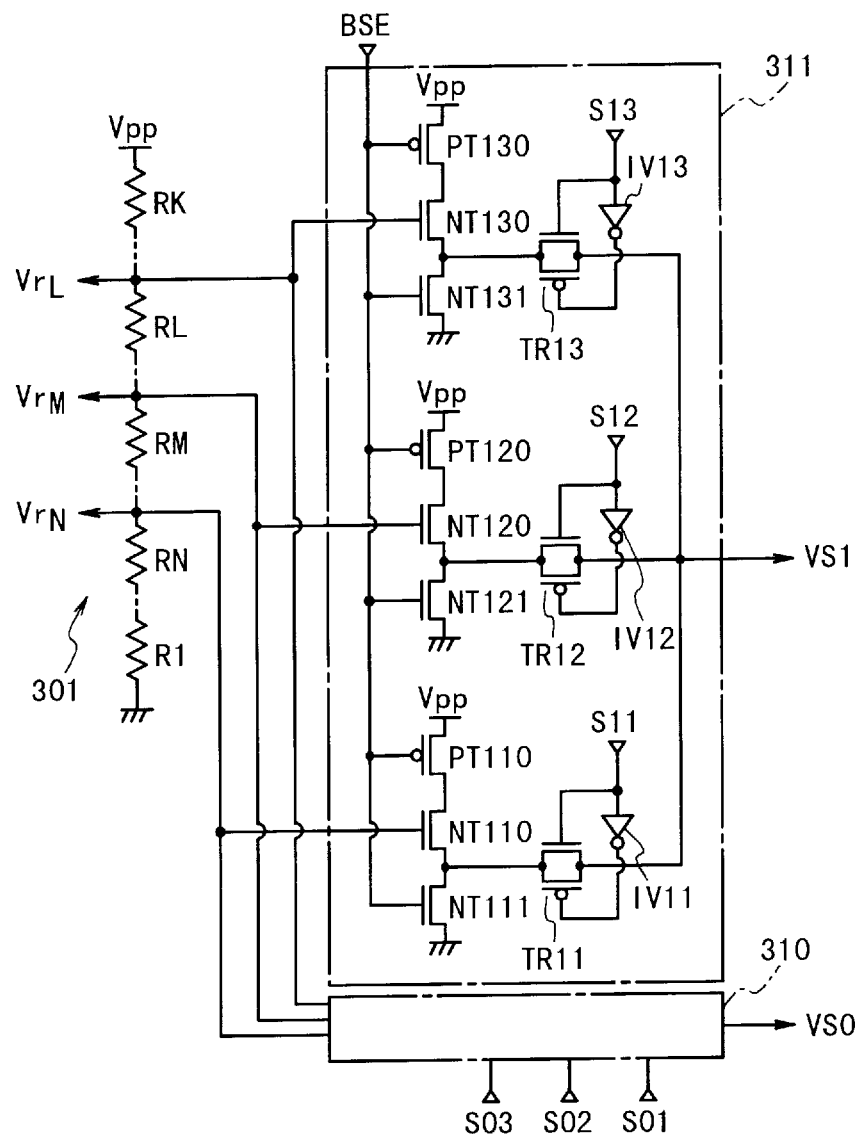
FIG. 6 is a circuit diagram illustrating the structure of a part of a source bias voltage setting circuit of FIG. 5.

Next, the source bias voltage setting circuit will be described. FIG. 6 is a circuit diagram illustrating the structure of the source voltage setting circuit 30. Referring to FIG. 6, the source voltage setting circuit 30 is composed of a reference potential generating circuit 301, bias voltage generating circuits 310 and 311 for the memory cell array blocks 10 and 11. The reference potential generating circuit 301 is composed of resistors R1, . . . , RN, . . . , RM, . . . , RL, . . . , RK, which are connected in series between the ground potential line and the power supply potential line Vpp. The reference potential generating circuit 301 receives the power supply potential Vpp for the write/erase operation to generate reference potentials VrL, VrM and VrN.

The bias voltage generating circuits 310 and 311 have the same structure in this embodiment. The bias voltage generating circuit 311 is composed of a set of a P-type MOS transistors PT110, N-type MOS transistors NT110 and NT111, a transfer gate TR11 and an inverter IN11, a set of a P-type MOS transistors PT120, N-type MOS transistors NT120 and NT121, a transfer gate TR12 and an inverter IN12, and a set of a P-type MOS transistors PT130, N-type MOS transistors NT130 and NT131, a transfer gate TR13 and an inverter IN11.

The MOS transistors of each of the sets are connected in series between the power supply potential line Vpp and the ground potential line. The MOS transistors NT130, NT120 and NT110 receive the reference potential VrL, VrM and VrN at the gates to generate the source bias voltages, respectively. The MOS transistor PT130, PT120 and PT110 receive a control signal BSE supplied from the control circuit (not shown) at the gates in an inverted form. The MOS transistors NT131, NT121 and NT111 receive the control signal BSE at the gates to discharge the source bias voltages at the un-activated state. The transfer gates TR11 and TR12 and TR13 and the inverters IV11, IV12 and IV13 transfers the source bias voltage to the common source terminal Vs1 in response to the potential selection signals S11, S12 and S13.

The bias voltage generating circuit 310 has the same structure as that of the bias voltage generating circuit 311 except that the potential selection signals are S01, S02 and S03.

In operation, in the bias voltage generating circuit 311 of this source bias voltage setting circuit 30 for the memory cell array block 11, the MOS transistors PT110, PT120 and PT130 are set to the conductive state in response to the transition of the activation signal BSE to the L level and the bias voltage generating circuit 311 is activated. By this, the respective MOS transistors NT130, NT120 and NT110 input the reference potentials VrL, VrM and VrN at the gates and generate the source bias voltage at the sources. The transfer gates TR11, TR12 and TR13 and the inverters IV11, IV12 and IV13 select the source bias voltage VS1 in response to the supply of each of the potential selection signals S11, S12 and S13 which are supplied from the erase cycle counter 40. Similarly, the bias voltage generating circuit 310 determines the source bias voltage VS0.

Figure 9:
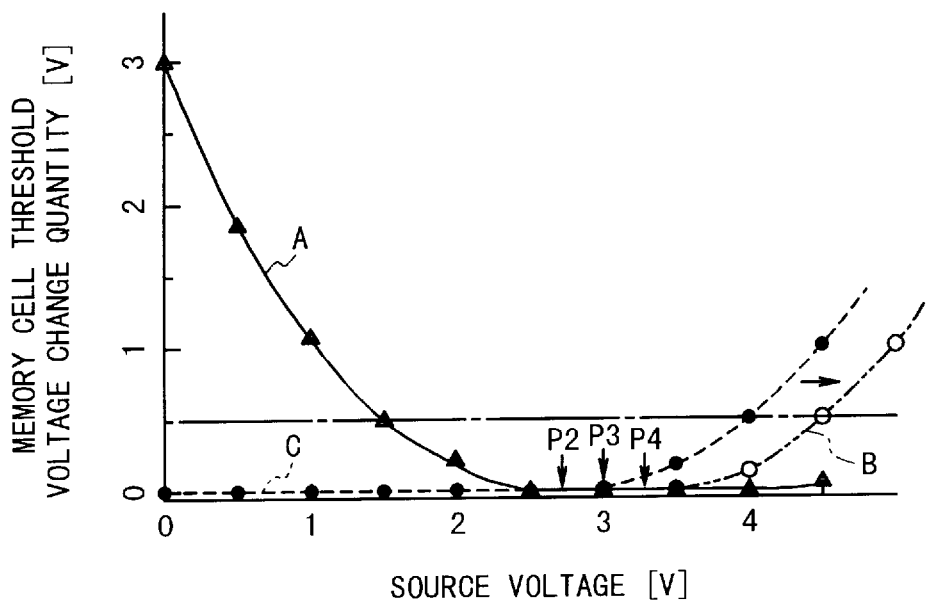
FIG. 9 is a characteristic diagram illustrating relation of source bias voltage and threshold voltage change quantity due to the gate disturb and the soft-erase in the non-volatile semiconductor memory device in the first embodiment.

FIG. 9 shows an influence by the gate disturb and the soft-erase to the source application voltage of this embodiment. Referring to FIG. 9, first, when there is a little number of times of the erase operation to the memory cell array block 11, e.g., when the selection signal S11 is H level, the voltage P2 is supplied as the source bias voltage VS1. When the erasure number of times of the memory cell array block 11 increases, the voltage P3 is supplied as the source bias voltage VS1, because the selection signal S12 becomes H level. In the same manner, when the selection signal S13 becomes H level, the voltage P3 is supplied as the source bias voltage Vs1.

In this way, as the number of times of the erase operation to the memory cell array block 11 increases, the source bias voltage is gradually changed high. As a result, the influence due to the gate disturb and the soft-erase can be restrained in minimum.

Next, the erase cycle counter 40A according to the second embodiment of the present invention will be described. In the first embodiment, the erase operation history data is the number of times of the erase operation. However, in the second embodiment, the erase operation history data is an erase time period.

Figure 10:
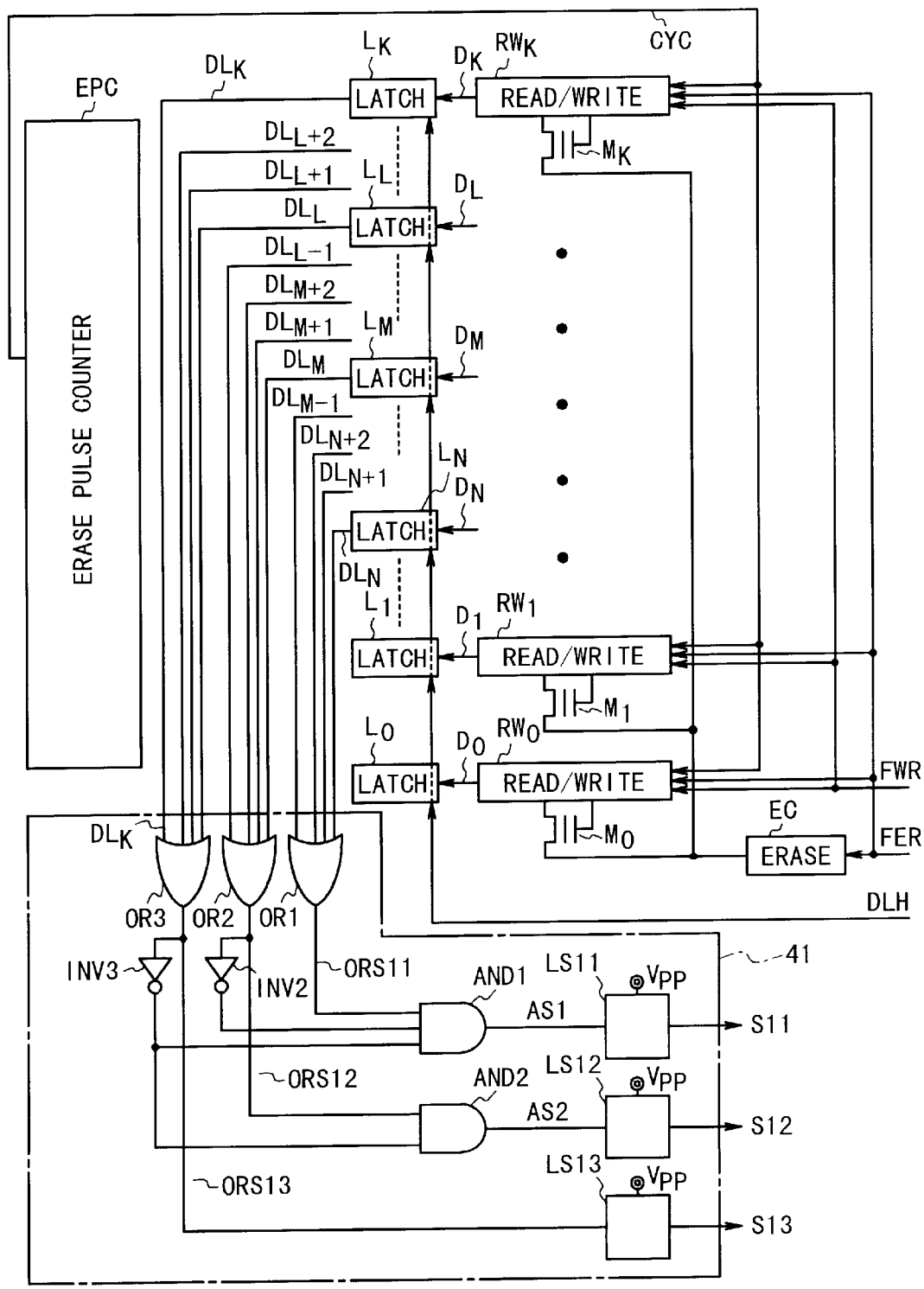
FIG. 10 is a circuit diagram illustrating the structure of a part of the erase cycle counter in the non-volatile semiconductor memory device according to a second embodiment of the present invention.

FIG. 10 shows the structure of the erase cycle counter 40, in which the same reference symbols and numerals are allocated for the same components as those of FIG. 7. Referring to FIG. 10, a point of difference of this embodiment from the above-mentioned first embodiment is in that an erase pulse counter EPC is provided instead of the adder ADD. Thus, the erasure speed of the memory cell array block 11 is detected, and the source bias voltage VS1 to the memory cell array block 11 is determined based on the erasure time period as the erase operation history data.

As this erase pulse counter EPC, the timer count circuit which measures an erasure time period in case of erasure of a usual flash memory is used. Because the other structure and the operation are the same as in the first embodiment other than the erasure number of times is replaced by the erasure time period, the description is omitted.

The basic theory of this embodiment utilizes the nature that the memory cell with a high erasure speed does not the influence of the soft-erase so much. As described above, because a correlation between the erasure speed and the soft-erase of the memory cell is obtained by evaluation, it could be considered that the source bias voltage set based on the erasure speed of the memory cell reflects the characteristic of the memory cell more than in the first embodiment in which the erasure number of times is used. Therefore, the influence due to the gate disturb and the soft-erase can be restrained in the same way in minimum.

As described above, the non-volatile semiconductor memory device of the present invention is composed of the source voltage setting circuits which independently set the optimal source voltages in a write operation in accordance with the erasure number of times of each of the memory cell array blocks, and the erase cycle counter which counts the erasure number of times of each of the memory cell array blocks and supplies the count value as the potential selection signal. Because the erasure number of times of the memory cell array block is detected, and the characteristic change of the memory cell by repeatedly erasing the memory cell array block of the flash memory is considered, and the source bias voltage of the memory cell array block is set, there is the effect that the influence due to the gate disturb and the soft-erase can be suppressed in minimum.

What is claimed is:

1. A non-volatile semiconductor memory device comprising:

a memory cell array composed of a plurality of non-volatile memory cells which are arranged in a matrix manner, wherein each word line is connected to a row of said memory cell array, and each bit line is connected to a column of said memory cell array, and wherein said memory cell array is divided into N blocks (N is an integer more than 1) in a row direction, and source terminals of said memory cells of each of said N blocks are connected in common to a common source node;

control signal generating means for monitoring erase operations to each of said N blocks to generate an erase operation history data for each of said N blocks, said erase operation history data for each of said N blocks indicating history of the erase operations to the corresponding blocks, and for generating a control signal for each of said N blocks other than a selected block based on the erase operation history data for the corresponding block when a write operation is performed to the selected block; and source voltage generating means for generating a source voltage for each of said N blocks other than the selected block based on the corresponding control signal to supply the generated source voltage to the common source node of the corresponding block, when the write operation is performed to the selected block.

2. A non-volatile semiconductor memory device according to claim 1, wherein said control signal generating means includes:

storing means for storing the erase operation history data for each of said N blocks; and output means for outputting the control signal for each of the N blocks other than the selected block based on the erase operation history data stored in said storing means for the corresponding block, when the write operation is performed to the selected block.

3. A non-volatile semiconductor memory device according to claim 2, wherein said control signal generating means further comprises:
  updating means for updating said erase operation history data for each of said N blocks based on the erase operation during initialization of the corresponding block.

4. A non-volatile semiconductor memory device according to claim 1, wherein the erase operation history data for each of said N blocks is a number of erase operations to the corresponding block.

5. A non-volatile semiconductor memory device according to claim 4, wherein said control signal generating means includes:
  a plurality of additional non-volatile memory cells for storing the erase operation history data for each of said N blocks;
  latching means for latching the erase operation history data for each of said N blocks from said plurality of additional memory cells;
  output means for outputting the control signal for each of the N blocks based on the latched erase operation history data for the corresponding block;
  erasing means for erasing a part of said plurality of additional memory cells corresponding to one of said N blocks to which the erase operation is performed;
  adding means for adding one to the latched erase operation history data for said one block to which the erase operation is performed; and
  write means for writing the added erase operation history data for said one block in said plurality of additional memory cells.

6. A non-volatile semiconductor memory device according to claim 1, wherein the erase operation history data for each of said N blocks is a total erase operation time to the corresponding block.

7. A non-volatile semiconductor memory device according to claim 6, wherein said control signal generating means includes:
  a plurality of additional non-volatile memory cells for storing the erase operation history data for each of said N blocks;
  latching means for latching the erase operation history data for each of said N blocks from said plurality of additional memory cells;
  output means for outputting the control signal for each of the N blocks based on the latched erase operation history data for the corresponding block;
  erasing means for erasing a part of said plurality of additional memory cells corresponding to one of said N blocks to which the erase operation is performed;
  counter means for counting an erase time period as the erase operation history data for said one block to which the erase operation is performed; and
  write means for writing the erase operation history data for said one block in said plurality of additional memory cells.

8. A non-volatile semiconductor memory device, according to claim 2, wherein said output means includes means for classifying the erase operation history data for each of said N blocks into one of a plurality of classes based on a magnitude of the erase operation history data, and for outputting a class signal indicating the classified class as the control signal for the corresponding block, and
  wherein said source voltage generating means generates the source voltage having a magnitude, which is determined based on the class signal, for each of said N blocks other than the selected block to supply to the common source node for the corresponding block.

9. A method of suppressing influence of gate disturb and soft erase in a non-volatile semiconductor memory device, comprising the steps of:
  providing a memory cell array composed of a plurality of non-volatile memory cells which are arranged in a matrix manner, wherein each word line is connected to a row of said memory cell array, and each bit line is connected to a column of said memory cell array, and wherein said memory cell array is divided into N blocks (N is an integer more than 1) in a row direction, and source terminals of said memory cells of each of said N blocks are connected in common to a common source node;
  reading an erase operation history data for each of said N blocks from a storage section when a write operation is performed to a selected block, wherein the erase operation history data for each of said N blocks indicates history of the erase operations to the corresponding block;
  generating a source voltage for each of said N blocks other than the selected block based on the read erase operation history data; and
  supplying the generated source voltage to the common source node of the corresponding block to suppress movement of electrons from or to a floating gate of each of the memory cells in the corresponding block.

10. A method according to claim 9, further comprising the step of updating the erase operation history data for each of said N blocks based on the erase operation to the corresponding block.

11. A method according to claim 10, wherein the erase operation history data of each of said N blocks indicates a number of times of the erase operation to the corresponding block, and said updating step includes adding one to the erase operation history data for each of said N blocks in response to the erase operation to the corresponding block.

12. A method according to claim 10, wherein the erase operation history data for each of said N blocks indicates a total erase operation time to the corresponding block, and said updating step includes adding a time period of the erase operation to the corresponding block to said erase operation history data for corresponding block.

13. A method according to claim 9, wherein said step of generating a control signal includes:
  determining one of a plurality of ranges to which the erase operation history data belongs; and
  generating the source voltage corresponding to the determined range, the source voltages generated in said step of generating a source voltage being different depending on the plurality of ranges.

14. A non-volatile semiconductor memory device, comprising:
  a first memory cell array composed of a plurality of non-volatile memory cells which are arranged in a matrix manner, wherein each word line is connected to a row of said memory cell array, and each bit line is connected to a column of said memory cell array, and wherein said memory cell array is divided into N blocks (N is an integer more than 1) in a row direction, and source terminals of said memory cells of each of said N blocks are connected in common to a common source node;

a second memory cell array comprising a plurality of non-volatile memory cells, for storing an erase operation history data for each of said N blocks, wherein the erase operation history data for each of said N blocks indicates history of the erase operation to the corresponding block;

reading means for reading said erase operation history data for each of said N blocks from said second memory cell array;

source voltage generating means for generating a source voltage;

control means for controlling said source voltage generating means to generate said source voltage for each of said N blocks other than a selected block based on the read erase operation history data, when a write operation is performed to the selected block; and voltage supply means for supplying the generated source voltage to the corresponding common source node to suppress movement of electrons from or to a floating gate of each of memory cells in each of said N blocks.

15. A non-volatile semiconductor memory device according to claim 14, said reading means further comprises updating means for updating the erase operation history data each of said N blocks based on the erase operation to the corresponding block.

16. A non-volatile semiconductor memory device according to claim 15, wherein the erase operation history data indicates a number of times of the erase operation, and said updating means includes means for adding one to the erase operation history data for one of said N blocks to which the erase operation is performed.

17. A non-volatile semiconductor memory device according to claim 15, wherein the erase operation history data indicates a total erase operation time to one of said N blocks, and said updating means includes means for adding a time period of the erase operation to said one block to the erase operation history data for said one block.

18. A non-volatile semiconductor memory device according to claim 14, wherein said control means includes:

determining means for determining one of a plurality of ranges to which the erase operation history data belongs; and generation control means for controlling said source voltage generating means to generate said source voltage for each of said N blocks other than the selected block based on the determined range.

* * * * *